(12) United States Patent
Anada et al.

(10) Patent No.: US 9,252,041 B2
(45) Date of Patent: Feb. 2, 2016

(54) ELECTROSTATIC CHUCK

(71) Applicant: TOTO LTD., Kitakyushu-shi, Fukuoka (JP)

(72) Inventors: Kazuki Anada, Fukuoka-ken (JP); Takuma Wada, Fukuoka-ken (JP)

(73) Assignee: Toto Ltd., Fukuoka (JP)

( * ) Notice: Subject to any disclaimer, the term of this patent is extended or adjusted under 35 U.S.C. 154(b) by 148 days.

(21) Appl. No.: 14/012,058

(22) Filed: Aug. 28, 2013

(65) Prior Publication Data

US 2014/0063682 A1 Mar. 6, 2014

(30) Foreign Application Priority Data

Aug. 29, 2012 (JP) .................. 2012-189313
Jul. 4, 2013 (JP) .................. 2013-141150

(51) Int. Cl.
*H01L 21/683* (2006.01)
*H01L 21/687* (2006.01)
(52) U.S. Cl.
CPC ...... *H01L 21/6833* (2013.01); *H01L 21/68757* (2013.01)
(58) Field of Classification Search
USPC ......................................................... 361/234
See application file for complete search history.

(56) References Cited

U.S. PATENT DOCUMENTS

| | | | | |
|---|---|---|---|---|
| 5,607,541 A * | 3/1997 | Kubota et al. ................. | 156/538 |
| 5,634,266 A * | 6/1997 | Sherstinsky et al. ............ | 29/825 |
| 5,777,838 A * | 7/1998 | Tamagawa et al. ........... | 361/234 |
| 6,215,641 B1 * | 4/2001 | Busse et al. ................... | 361/234 |
| 6,535,371 B1 * | 3/2003 | Kayamoto et al. ............ | 361/234 |
| 7,042,697 B2 * | 5/2006 | Tsuruta et al. ................ | 361/234 |
| 8,027,171 B2 * | 9/2011 | Miyashita et al. ............ | 361/794 |
| 2002/0080551 A1 * | 6/2002 | Kitagawa et al. ............. | 361/302 |
| 2007/0074806 A1 | 4/2007 | Kojima et al. | |
| 2009/0115029 A1 * | 5/2009 | Koyama et al. ............... | 257/632 |
| 2009/0284893 A1 * | 11/2009 | Ando et al. .................... | 361/234 |
| 2012/0154974 A1 * | 6/2012 | Bhatnagar et al. ............ | 361/234 |
| 2013/0026720 A1 * | 1/2013 | Hori et al. ..................... | 279/128 |
| 2013/0201597 A1 * | 8/2013 | Ishikawa et al. .............. | 361/234 |
| 2013/0201598 A1 * | 8/2013 | Ishikawa et al. .............. | 361/234 |
| 2014/0063681 A1 * | 3/2014 | Anada ............... H01L 21/68757 361/234 |
| 2014/0063682 A1 * | 3/2014 | Anada ............... H01L 21/68757 361/234 |
| 2014/0071582 A1 * | 3/2014 | Anada .................... H02N 13/00 361/234 |

FOREIGN PATENT DOCUMENTS

JP 08-119720 A 5/1996
JP H08-119720 A 5/1996

(Continued)

*Primary Examiner* — Thienvu Tran
*Assistant Examiner* — Angela Brooks
(74) *Attorney, Agent, or Firm* — Carrier Blackman & Associates, P.C.; Joseph P. Carrier; William D. Blackman

(57) ABSTRACT

To provide an electrostatic chuck, including: a ceramic dielectric substrate having a first major surface on which an object to be processed is mounted, and a second major surface on a side opposite the first major surface, the ceramic dielectric substrate being a polycrystalline ceramic sintered body; and an electrode layer interposed between the first major surface and the second major surface of the ceramic dielectric substrate, the electrode layer being integrally sintered with the ceramic dielectric substrate, and the electrode layer includes a first portion having conductivity, and a second portion that bonds the first dielectric layer and the second dielectric layer, and the mean grain size of crystals included in the second portion is smaller than the mean grain size of crystals included in the ceramic dielectric substrate.

14 Claims, 5 Drawing Sheets

(56) References Cited

FOREIGN PATENT DOCUMENTS

| JP | H10-279349 A | 10/1998 |
| JP | H11-067886 A | 3/1999 |
| JP | H11-312729 A | 11/1999 |
| JP | 2011-60826 A | 3/2011 |
| JP | 2011-060826 A | 3/2011 |

\* cited by examiner

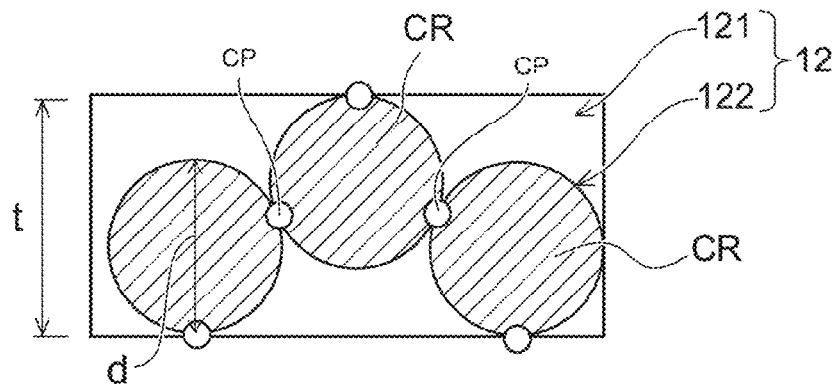
FIG. 4A
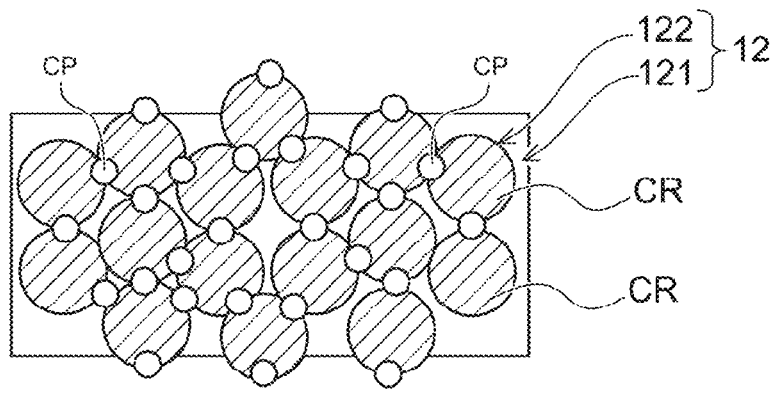
FIG. 4B
| d／t | 0.3 | | 0.5 | | 0.8 | | 1 | |
|---|---|---|---|---|---|---|---|---|
| Conductivity | Yes | ○ | Yes | ○ | No | × | No | × |
| Peeling during sintering | No | ○ | No | ○ | No | ○ | Yes | × |
FIG. 4C

ELECTROSTATIC CHUCK

CROSS-REFERENCE TO RELATED APPLICATIONS

This application is based upon and claims the benefit of priorities from Japanese Patent Application No. 2012-189313, filed on Aug. 29, 2012 and Japanese Patent Application No. 2013-141150, filed on Jul. 4, 2013; the entire contents of which are incorporated herein by reference.

FIELD

An aspect of the invention relates to an electrostatic chuck, and more specifically relates to an electrostatic chuck capable of maintaining at a desired temperature an object to be processed that is adhered and held.

BACKGROUND

Electrostatic chucks are used as means to adhere and hold an object to be processed (such as a semiconductor wafer or a glass substrate) in a plasma processing chamber that performs etching, chemical vapor deposition (CVD), sputtering, ion implantation, ashing, and the like.

Methods of fabricating the electrostatic chuck include sintering a plate-like ceramic dielectric substrate, and forming an electrode on one side of the substrate by CVD, sputtering, or the like (single plate structure), or fabricating ceramic green sheets by the sheet forming method, and laminating a plurality of layers of green sheet on the top and bottom of a green sheet on which an electrode is printed (internal electrode structure). In the electrostatic chuck, an internal electrode structure is suitable, from the point of view of ensuring sufficient adhesion force and high withstand voltage.

However, after plasma processing, residues or matter generated from the semiconductor wafer or applied films adhere to the inner faces of the chamber. When plasma processing is repeatedly carried out, the residues and generated matter are gradually deposited, and eventually they peel from the inner faces of the chamber and adhere to the surface of the object to be processed such as a semiconductor wafer, a glass substrate, or the like, which causes a reduction in manufacturing yield.

Therefore, conventionally, periodically, the inside of the chamber is cleaned by plasma, and the residues and adhering matter adhering to the inner faces of the chamber are removed. In this case, in some cases, so-called waferless plasma cleaning is carried out, by processing without covering the surface of the electrostatic chuck with a dummy wafer. In waferless plasma cleaning, the surface of the electrostatic chuck is directly exposed to cleaning plasma such as $O_2$ gas, $CF_4$ gas, or the like during cleaning.

When waferless plasma cleaning is carried out for electrostatic chuck, particles are separated from the ceramic surface and erosion occurs at the grain boundaries, so the surface roughness increases. As a result, problems such as reduction in the electrostatic adhesion force, increase in the quantity of leakage of sealing gas, lowering in the heat transfer coefficient of the solid contact interface with the semiconductor wafer, and the like occur, and after a short period of time, it is necessary to replace the electrostatic chuck.

Therefore, Japanese Unexamined Patent Application Publication No. H10-279349 discloses a method of manufacturing an electrostatic chuck with an internal electrode structure that uses high purity alumina as the dielectric body, as a method of suppressing the change in surface roughness due to plasma irradiation by halogen gas or the like.

Japanese Unexamined Patent Application Publication No. H10-279349 discloses using a green sheet that uses alumina powder with 99.5% purity as a conductor by applying a paste including powders such as W, Mo, WC, TiC, TiN or the like.

Also, Japanese Unexamined Patent Application Publication No. H08-119720 discloses the structure of an electrostatic chuck in which a conductor made from Pd on its own or Pd including Ag of not more than 40% by weight is applied to a green sheet that uses alumina powder with purity of not less than 99.9% as the internal electrode.

However, when fabricating an electrostatic chuck with an internal electrode structure using high purity alumina green sheets, the bond between the internal electrode layer and the high purity alumina layers on the top and bottom of the internal electrode layer is weak, and separation at the boundary between the high purity alumina layer and the internal electrode layer can easily occur during processing. Therefore, in order to strengthen the bond, there is the method of adding alumina to the internal electrode layer as a common material, but in this case, the problem that the conductivity of the internal electrode is reduced by adding the alumina occurs.

SUMMARY

According to an aspect of the present invention, an electrostatic chuck includes: a ceramic dielectric substrate having a first major surface on which an object to be processed is mounted, and a second major surface on a side opposite the first major surface, the ceramic dielectric substrate being a polycrystalline ceramic sintered body; and an electrode layer interposed between the first major surface and the second major surface of the ceramic dielectric substrate, the electrode layer being integrally sintered with the ceramic dielectric substrate, the ceramic dielectric substrate including a first dielectric layer between the electrode layer and the first major surface, and a second dielectric layer between the electrode layer and the second major surface, and the electrode layer includes a first portion having conductivity, and a second portion that bonds the first dielectric layer and the second dielectric layer, and the mean grain size of crystals included in the second portion is smaller than the mean grain size of crystals included in the ceramic dielectric substrate.

BRIEF DESCRIPTION OF THE DRAWINGS

FIGS. 4A to 4C are explanatory views of the action of the second portion; and

DETAILED DESCRIPTION

Figure 1:
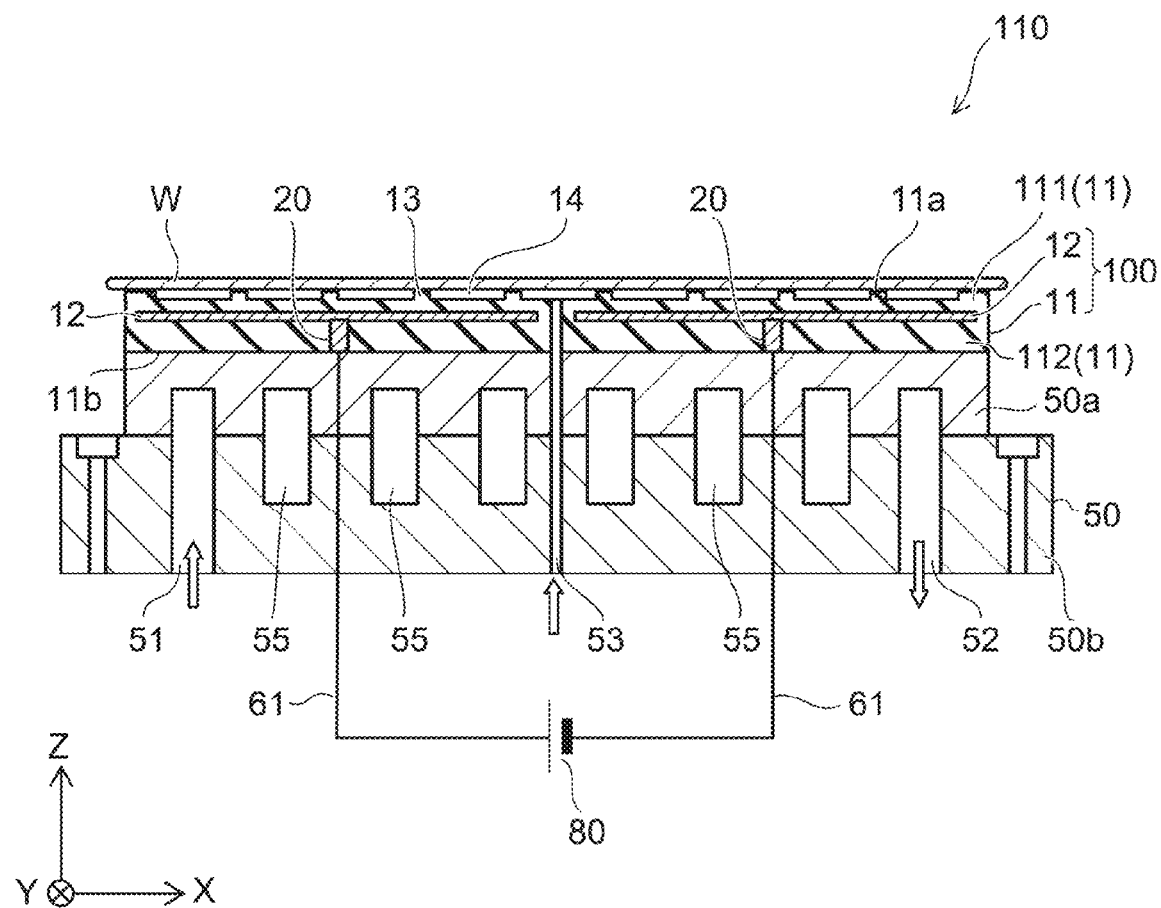
FIG. 1 is a schematic cross-sectional view illustrating the configuration of an electrostatic chuck according to this embodiment.

A first aspect of the present invention is an electrostatic chuck including: a ceramic dielectric substrate having a first major surface on which an object to be processed is mounted, and a second major surface on a side opposite the first major surface, the ceramic dielectric substrate being a polycrystalline ceramic sintered body; and an electrode layer interposed between the first major surface and the second major surface of the ceramic dielectric substrate, the electrode layer being integrally sintered with the ceramic dielectric substrate, the ceramic dielectric substrate including a first dielectric layer between the electrode layer and the first major surface, and a second dielectric layer between the electrode layer and the second major surface, and the electrode layer includes a first portion having conductivity, and a second portion that bonds the first dielectric layer and the second dielectric layer, and the mean grain size of crystals included in the second portion is smaller than the mean grain size of crystals included in the ceramic dielectric substrate.

According to this electrostatic chuck, the mean grain size of the crystals included in the second portion are smaller than the mean grain size of the crystals included in the ceramic dielectric substrate, so it is easy to connect the first dielectric layer and the second dielectric layer by the second portion. Also, the second portion does not obstruct the conductive network of the first portion. As a result, it is possible to ensure the conductivity of the electrode layer, and the reliable bonds between the electrode layer and the ceramic dielectric substrate.

A second aspect of the present invention is the electrostatic chuck according to the first aspect of the invention, wherein the second portion includes a portion that extends in a direction not parallel to the first major surface.

According to this electrostatic chuck, the first portion and the second portion form a three-dimensional network within the electrode layer, so the conductivity of the electrode layer is ensured, and it is possible to achieve a reliable bond between the electrode layer and the ceramic dielectric substrate.

A third aspect of the present invention is the electrostatic chuck according to the second aspect of the invention, wherein the crystal grains included in the ceramic dielectric substrate are bonded to the crystal grains included in the second portion by a solid phase sintering or a liquid phase sintering.

According to this electrostatic chuck, impurities such as glass or the like are not diffused within the ceramic dielectric substrate, so it is possible to ensure the plasma durability of the ceramic dielectric substrate.

A fourth aspect of the present invention is the electrostatic chuck according to the first aspect of the invention, wherein the crystal grains included in the ceramic dielectric substrate are bonded together by the solid phase sintering or the liquid phase sintering.

According to this electrostatic chuck, impurities such as glass or the like are not diffused within the ceramic dielectric substrate, so it is possible to ensure the plasma durability of the ceramic dielectric substrate.

A fifth aspect of the present invention is the electrostatic chuck according to the first aspect of the invention, wherein the first portion is directly bonded to the second portion.

According to this electrostatic chuck, impurities such as glass or the like are not diffused within the ceramic dielectric substrate, so it is possible to ensure the plasma durability of the ceramic dielectric substrate.

A sixth aspect of the present invention is the electrostatic chuck according to the first aspect of the invention, wherein the purity of the ceramic dielectric substrate is not less than 99.9% by weight.

According to this electrostatic chuck, impurities such as glass or the like are not diffused within the ceramic dielectric substrate, so it is possible to ensure the plasma durability of the ceramic dielectric substrate.

A seventh aspect of the present invention is the electrostatic chuck according to the third aspect of the invention, wherein the material of the second portion is the same as the material of the ceramic dielectric substrate.

According to this electrostatic chuck, the adhesive sinterability of the first dielectric layer and the second dielectric layer is increased by the second portion.

An eighth aspect of the present invention is the electrostatic chuck according to the first aspect of the invention, wherein the thickness of the first dielectric layer is not less than 100 micrometers.

According to this electrostatic chuck, the thickness of a first dielectric layer is not less than 100 μm, so it is possible to maintain sufficient withstand voltage.

A ninth aspect of the present invention is the electrostatic chuck according to the first aspect of the invention, wherein the thickness of the electrode layer is not more than 15 micrometers.

According to this electrostatic chuck, it is possible to relieve concentration of stress in the electrode layer, and to prevent peeling of the electrode layer from the ceramic dielectric substrate.

A tenth aspect of the present invention is the electrostatic chuck according to the first aspect of the invention, wherein the mean grain size of the crystals included in the second portion is not more than ½ the thickness of the electrode layer.

According to this electrostatic chuck, the dielectric particles of the second portion enter the electrode layer, so it is possible to improve the bond between the electrode layer and the ceramic dielectric substrate, and it is also possible to ensure sufficient conductivity by the first portion.

An eleventh aspect of the present invention is the electrostatic chuck according to the first aspect of the invention, wherein the material of the crystals included in the ceramic dielectric substrate is $Al_2O_3$.

According to this electrostatic chuck, it is possible to fabricate a high purity ceramic sintered body having sufficient plasma durability.

Embodiments of the invention will now be described with reference to the drawings. Note that the same numerals are applied to similar constituent elements in the drawings and detailed descriptions of such constituent elements are appropriately omitted.

FIG. 1 is a schematic cross-sectional view illustrating the configuration of an electrostatic chuck according to this embodiment.

Figure 2A:
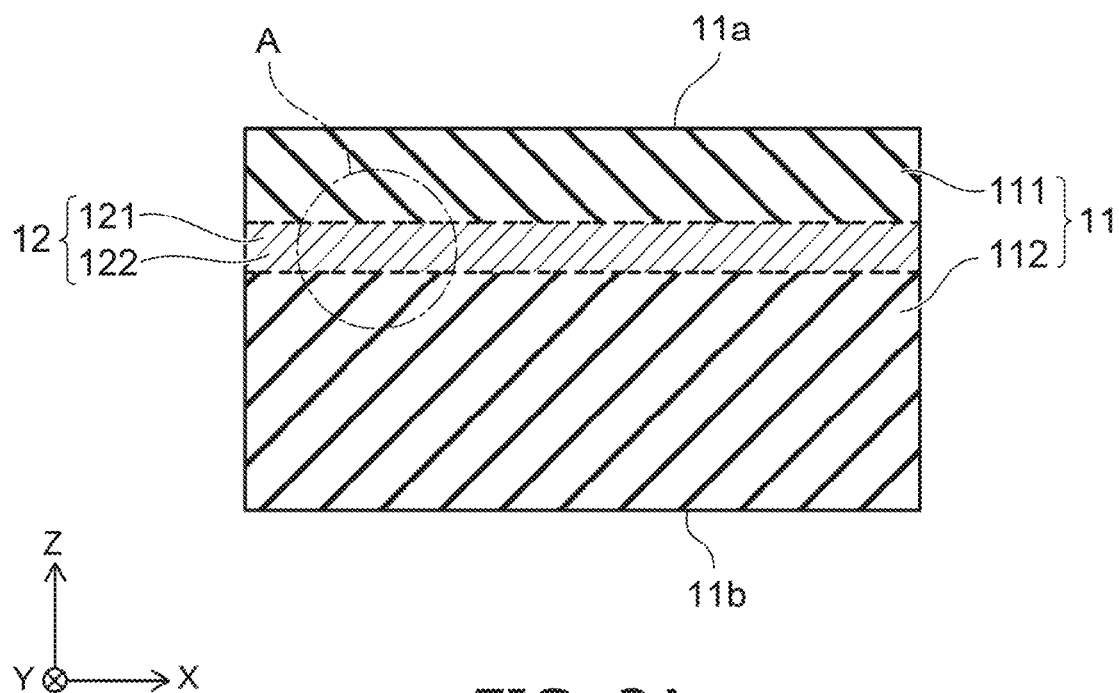
FIG. 2A and FIG. 2B are schematic cross-sectional views illustrating a configuration of the electrode layer.
Figure 2B:
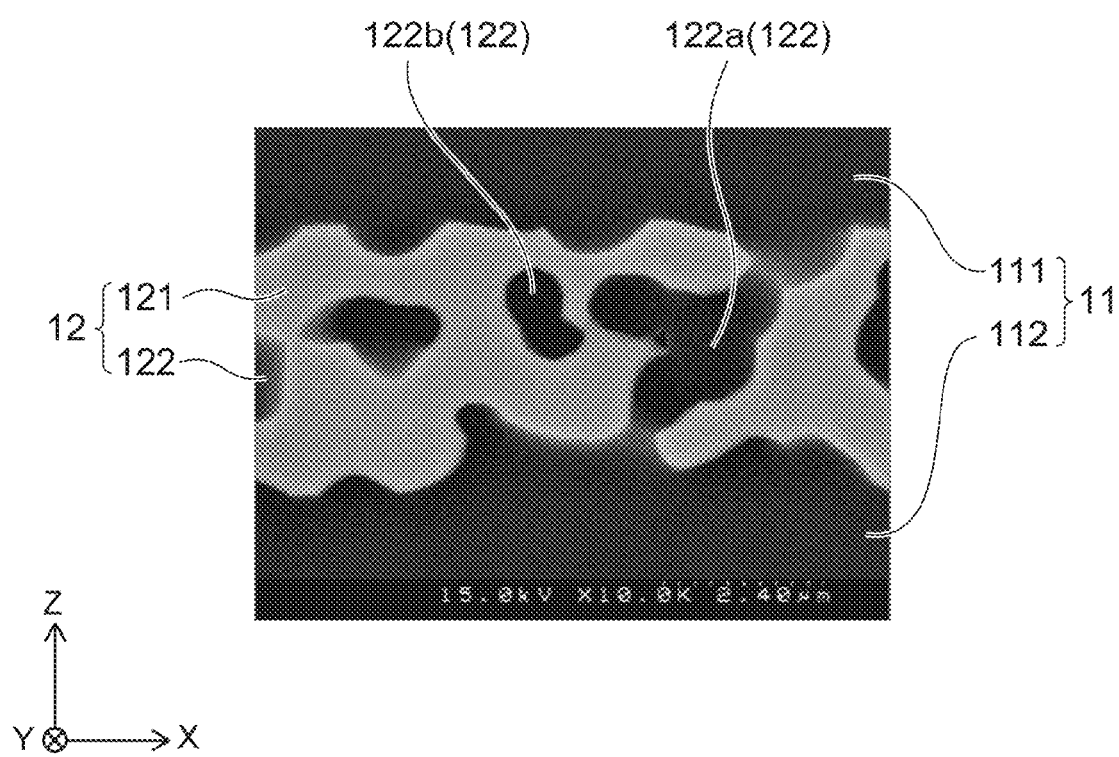

FIG. 2A and FIG. 2B are schematic cross-sectional views illustrating a configuration of the electrode layer.

FIG. 2A illustrates a schematic cross-sectional view of an enlarged portion of the electrode layer, and FIG. 2B shows a scanning electron microscope (SEM) image of a cross section at the portion A illustrated in FIG. 2A.

As illustrated in FIG. 1, an electrostatic chuck 110 according to this embodiment includes a ceramic dielectric substrate 11, and an electrode layer 12.

The ceramic dielectric substrate 11 is, for example, a flat plate-like substrate made of a polycrystalline ceramic sintered body, and includes a first major surface 11a on which an object to be processed W such as a semiconductor wafer or the like is mounted, and a second major surface 11b on a side opposite the first major surface 11a.

The electrode layer 12 is interposed between the first major surface 11a and the second major surface 11b of the ceramic dielectric substrate 11. In other words, the electrode layer 12 is formed so as to be inserted into the ceramic dielectric substrate 11. The electrode layer 12 is integrally sintered with the ceramic dielectric substrate 11. An electrostatic chuck 100 is a plate-like structure that includes the ceramic dielectric substrate 11 and the electrode layer 12 provided in the ceramic dielectric substrate 11.

The electrostatic chuck 110 applies an adhere and hold voltage 80 to the electrode layer 12, thereby generating charge on the first major surface 11a side of the electrode layer 12 and using a resulting electrostatic force to adhere and hold the object to be processed W.

In the description of this embodiment, the direction that joins the second major surface 11b and the first major surface 11a is denoted as the Z direction, one of the directions perpendicular to the Z direction is denoted as the X direction, and the direction perpendicular to the Z direction and the X direction is denoted as the Y direction.

The ceramic dielectric substrate 11 includes a first dielectric layer 111 between the electrode layer 12 and the first major surface 11a, and a second dielectric layer 112 between the electrode layer 12 and the second major surface 11b.

The electrode layer 12 is provided along the first major surface 11a and the second major surface 11b of the ceramic dielectric substrate 11. The electrode layer 12 is an adhering electrode for adhering and holding the object to be processed W. The electrode layer 12 may be a unipolar type or a bipolar type. Also, the electrode layer 12 may be a tripolar type or another multi-polar type. The number and arrangement of electrode layers 12 are selected as appropriate. The electrode layer 12 illustrated in FIG. 1 is of the bipolar type, having two poles in the same plane.

As illustrated in FIG. 2A and FIG. 2B, the electrode layer 12 includes a first portion 121 and a second portion 122. The first portion 121 has conductivity. The second portion 122 includes a portion that bonds the first dielectric layer 111 and the second dielectric layer 112.

The mean grain size of the crystals included in the second portion 122 of the electrode layer 12 is smaller than the mean grain size of the crystals included in the ceramic dielectric substrate 11. When the mean grain size of the crystals included in the second portion 122 is smaller than the mean grain size of the crystals included in the ceramic dielectric substrate 11, it is easy to connect the first dielectric layer 111 and the second dielectric layer 112 by the second portion 122.

Also, when the mean grain size of the crystals included in the second portion 122 is smaller than the mean grain size of the crystals included in the ceramic dielectric substrate 11, the conductive network of the first portion 121 is difficult to disrupt by the second portion 122. In other words, the greater the mean grain size of the crystals included in the second portion 122, the more easily the first portion 121 can be divided by the crystals of the second portion 122. On the other hand, when the mean grain size of the crystals included in the second portion 122 is small, the continuity of the first portion 121 is sufficiently maintained, so the conductive network of the first portion 121 is easily ensured.

By making the mean grain size of the crystals included in the second portion 122 smaller than the mean grain size of the crystals included in the ceramic dielectric substrate 11, it is possible to ensure the conductivity of the electrode layer 12, and to reliably bond the electrode layer and the ceramic dielectric substrate.

Here, a specific example of the configuration of the electrostatic chuck 110 is described.

As illustrated in FIG. 1, the electrostatic chuck 110 is attached to a baseplate 50. The baseplate 50 is a reference for attaching the electrostatic chuck 110. To attach the electrostatic chuck 110 to the baseplate 50, a heat-resistant resin such as silicone or the like, indium bonding, brazing, or the like can be used.

The baseplate 50 is, for example, divided into an upper portion 50a and a lower portion 50b made of aluminum. A communication path 55 is provided between the upper portion 50a and the lower portion 50b. The communication path 55 has a first end connected to an input path 51 and a second end connected to an output path 52.

The baseplate 50 plays the role of adjusting the temperature of the electrostatic chuck 110. For example, when the electrostatic chuck 110 is cooled, a cooling medium is caused to flow from the input path 51, pass through the communication path 55, and flow out from the output path 52. Accordingly, heat from the baseplate 50 is absorbed by the cooling medium, and the electrostatic chuck 110 attached to the baseplate 50 can be cooled.

On the other hand, when the electrostatic chuck 110 is to retain heat, a heat-holding medium can be supplied to the communication path 55. Alternatively, a heating element can be included in the electrostatic chuck 110 and the baseplate 50. In this way, when the temperature of the electrostatic chuck 110 is adjusted via the baseplate 50, the temperature of the object to be processed W adhered and held by the electrostatic chuck 110 can be easily adjusted.

Also, on the first major surface 11a side of the ceramic dielectric substrate 11, protrusions 13 are provided as required, and grooves 14 are provided between the protrusions 13. The grooves 14 are in communication, and spaces are formed between a rear surface of the object to be processed W mounted on the electrostatic chuck 110 and the grooves 14.

The grooves 14 are connected to introduction paths 53 which pierce through the baseplate 50 and the ceramic dielectric substrate 11. When a transfer gas such as helium (He) or the like is introduced from introduction paths 53 with the object to be processed W in a state of being adhered and held, the transfer gas flows into the space provided between the object to be processed W and the grooves 14, and the object to be processed W can be directly cooled by the transfer gas.

Here, by appropriately selecting the height of the protrusions 13 (depth of the grooves 14), an area ratio of the protrusions 13 and grooves 14, and shapes thereof, a temperature of the object to be processed W and particles adhering to the object to be processed W can be controlled to a preferred state.

A connection portion 20 is provided on the second major surface 11b of the ceramic dielectric substrate 11. A contact electrode 61 is provided in the upper portion 50a of the baseplate 50 in a position corresponding to the position of the connection portion 20. Hence, when the electrostatic chuck 110 is attached to the upper portion 50a of the baseplate 50, the contact electrode 61 contacts the connection portion 20 and electrical conduction can thereby be obtained between the contact electrode 61 and the electrode layer 12 via the connection portion 20.

For the contact electrode 61, a moveable probe may, for example, be used. Accordingly, a reliable connection is obtained between the contact electrode 61 and the connection portion 20, and damage to the connection portion 20 caused by the contact of the contact electrode 61 is minimized. Note that the contact electrode 61 is not limited to that described above, and may take any form. The contact electrode 61 may simply contact the connection portion 20, or engage with or be screwed into the connection portion 20.

Next, the ceramic dielectric substrate 11 is specifically described.

The material of the crystals included in the ceramic dielectric substrate 11 may include, for example, any of $Al_2O_3$, $Y_2O_3$, and YAG. By using this material, it is possible to increase the insulation resistance and the resistance to plasma erosion of the ceramic dielectric substrate 11. From the point of view of plasma durability, preferably, $Al_2O_3$ is used as the material of the ceramic dielectric substrate 11.

Preferably, the crystal grains included in the ceramic dielectric substrate 11 are joined together by solid phase sintering or liquid phase sintering. In other words, crystal grains are bonded together without sintering agent between the crystals. By not using a sintering agent, impurities such as glass or the like do not diffuse within the ceramic dielectric substrate 11, and sufficient plasma durability of the ceramic dielectric substrate 11 is ensured.

Preferably, the purity of the ceramic dielectric substrate 11 is not less than 99.9% by weight. If the impurities included in the ceramic dielectric substrate 11 are few, impurities such as glass or the like do not diffuse within the ceramic dielectric substrate 11, and sufficient plasma durability of the ceramic dielectric substrate 11 is ensured.

The first dielectric layer 111 of the ceramic dielectric substrate 11 has a thickness of not less than 100 μm. When the thickness of the first dielectric layer 111 is not less than 100 μm, it is possible to maintain sufficient withstand voltage in the electrostatic chuck 110. The thickness of the first dielectric layer greatly affects the adhesion force, so it can be set as appropriate in order that the temperature of the object to be processed will be the desired temperature. In this embodiment, the thickness of the first dielectric layer 111 can be set to, for example, from 100 μm to 1000 μm, and more preferably from 100 μm to 500 μm.

The thickness of the second dielectric layer 112 of the ceramic dielectric substrate 11 can likewise be set as appropriate. The overall thickness of the electrostatic chuck substrate 100 in which the ceramic dielectric substrate 11 and the electrode layer 12 are provided is, for example, from approximately 0.5 mm to 10 mm, taking into consideration the mechanical strength, cooling properties, heating properties, reliability, yield, and the like of the ceramic dielectric substrate 11. The overall thickness of the electrostatic chuck substrate 100 is preferably from approximately 0.5 mm to 7 mm. The overall thickness of the electrostatic chuck substrate 100 is more preferably from approximately 0.5 mm to 5 mm.

According to the knowledge obtained by the inventors, the advantages of this embodiment are greater for a relatively thick ceramic dielectric substrate 11 than for a relatively thin ceramic dielectric substrate 11. From the effect of the ceramic dielectric substrate 11 passing infrared light, it is possible to reduce temperature differences produced in the ceramic dielectric substrate 11. As a result, the cooling properties of the relatively thick ceramic dielectric substrate 11 are more excellent than the cooling properties of the relatively thin ceramic dielectric substrate 11. The heating properties of the relatively thick ceramic dielectric substrate 11 are more excellent than the heating properties of the relatively thin ceramic dielectric substrate 11.

For example, in some cases, a heater (not illustrated) that raises the temperature of the object to be processed W is provided. In this case, the heater is incorporated in the second dielectric layer 112, for example. Alternatively, the heater may be provided in the same position as the second major surface 11b, or it may be incorporated in the baseplate 50.

When the thickness of the ceramic dielectric substrate 11 increases, the thickness of the second dielectric layer 112 increases. Therefore, the distance between the electrode layer 12 and the heater increases. In this way, it is possible to ensure a longer insulation distance from the electrode layer 12 to the heater, and it is possible to increase the reliability of the electrostatic chuck 110.

As described later, one example of a method of manufacturing the electrostatic chuck 110 is to form a sheet. For example, by varying the number of laminations of the sheet, it is possible to adjust the thickness of the ceramic dielectric substrate 11. For example, if the thickness of a sintered body is increased, the load of the sintered body increases. According to the knowledge obtained by the inventors, when the load of the sintered body increases, warping of the sintered body decreases. In this way, the thicknesses of the first dielectric layer 111 and the second dielectric layer 112 and the dielectric layer are substantially uniform. Therefore, the adhesion force generated by the electrostatic chuck 110 is also uniform, and the temperature of the object to be processed W such as a semiconductor wafer or the like becomes substantially uniform.

If $Y_2O_3$ or YAG is used as the material of the ceramic dielectric substrate 11, the transmittance of infrared light in terms of a thickness of 1 mm is not less than approximately 20% and not more than approximately 90%.

If $Al_2O_3$ is used as the material of the ceramic dielectric substrate 11, the transmittance of infrared light in terms of a thickness of 1 mm is not less than approximately 20% and not more than 90%. More preferably, if $Al_2O_3$ is used as the material of the ceramic dielectric substrate 11, the transmittance of infrared light in terms of a thickness of 1 mm is greater than 30% and not more than 90%. According to the knowledge obtained by the inventors, if $Al_2O_3$ is used as the material of the ceramic dielectric substrate 11, it is possible to fabricate the ceramic dielectric substrate 11 with the transmittance of infrared light in terms of a thickness of 1 mm of greater than 30% and not more than 90%.

If foreign matter is included in the first dielectric layer 111 of the ceramic dielectric substrate 11, the temperature of the wafer, which is the object to be processed W, mounted on the first dielectric layer 111 can rise.

According to the knowledge obtained by the inventors, if the external diameter (mm) of the foreign matter included in the first dielectric layer 111 of the ceramic dielectric substrate 11 is not more than 3 mm, it is possible to suppress the temperature rise of the wafer to not more than 5° C. Alternatively, taking into consideration that foreign matter with an external diameter of not less than 0.05 mm can be seen with a stereoscopic microscope, if the external diameter of the foreign matter is not less than 0.05 mm and not more than 3 mm, it is possible to suppress the temperature rise of the wafer to not more than 5° C.

Also, according to the knowledge obtained by the inventors, if the area ratio (%) of the foreign matter relative to the area of the ceramic dielectric substrate 11 as seen in the Z direction is not more than 0.16%, it is possible to suppress the rise in temperature of the wafer to not more than 5° C. Alternatively, if it is assumed that the external diameter of the foreign matter is not less than 0.1 mm, if the area ratio of the foreign matter is not less than 0.002% and not more than 0.16%, it is possible to suppress the temperature rise of the wafer to not more than 5° C.

Next, the electrode layer 12 is specifically described.

As illustrated in FIG. 2A, the electrode layer 12 is provided between the first dielectric layer 111 and the second dielectric layer 112 of the ceramic dielectric substrate 11. The electrode layer 12 is integrally sintered with the ceramic dielectric substrate 11.

As shown in FIG. 2B, the first portion 121 includes a metal material. Palladium (Pd), platinum (Pt) or the like can be used as the metal material. In this embodiment, Pd is used as the material of the first portion 121.

The first portion 121 includes a continuous region where particles of the metal material are bonded together. In the SEM cross-sectional image shown in FIG. 2B, a plurality of regions as first portions 121 is shown, but each of the regions is connected at some location. Therefore, when a voltage is applied to the electrode layer 12, each of the regions of the first portion 121 is at the same potential.

In a cross-section along the X-Y plane of the electrode layer 12, the occupancy ratio of the second portion 122 is not less than 12 area percent and not more than 65 area percent, and preferably is not less than 15 area percent and not more than 58 area percent, and more preferably is not less than 18 area percent and not more than 49 area percent.

Also, in a cross-section along the Z-X plane of the electrode layer 12, the occupancy ratio of the first portion 121 relative to the second portion 122 is not less than 30 area percent and not more than 90 area percent, and preferably is not less than 40 area percent and not more than 80 area percent, and more preferably is not less than 42 area percent and not more than 73 area percent.

The mean grain size of the crystals included in the second portion 122 of the electrode layer 121 is smaller than the mean grain size of the crystals included in the ceramic dielectric substrate 11.

The mean grain size can be derived from, for example, an SEM image.

Figure 3A:
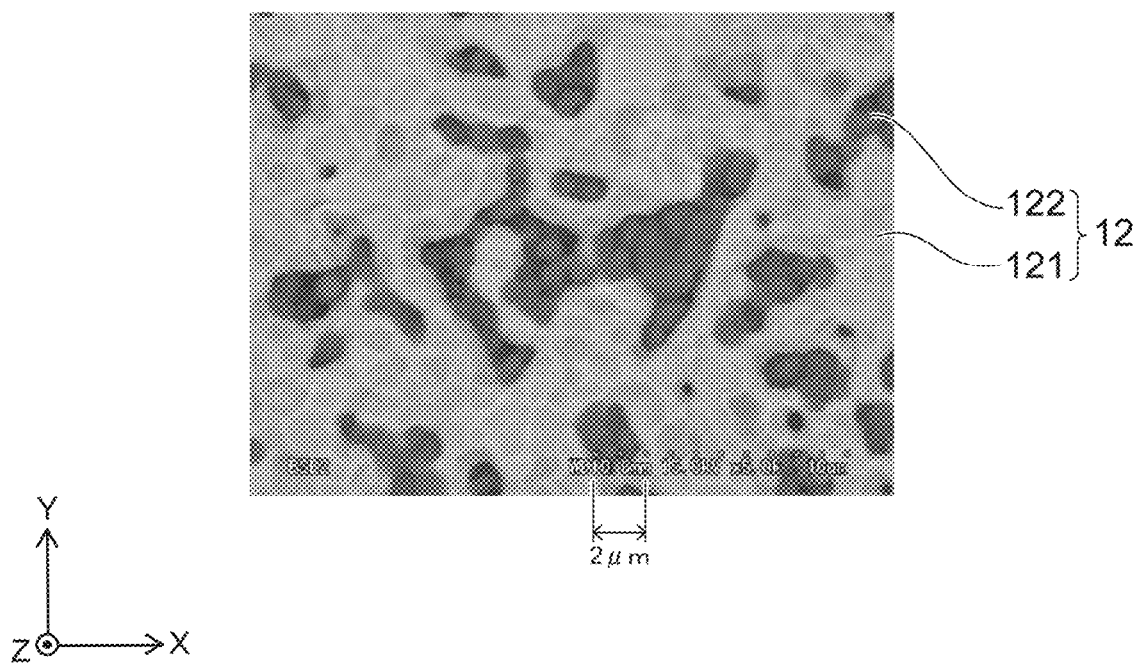
FIG. 3A and FIG. 3B show the surface of the electrostatic chuck.
Figure 3B:
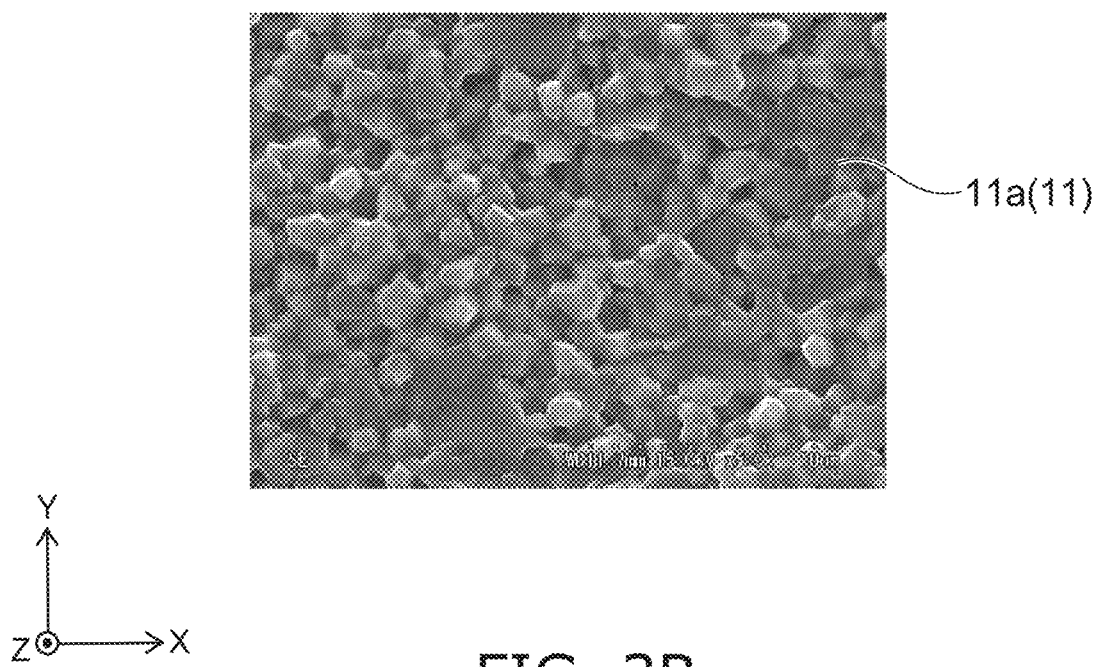

FIG. 3A and FIG. 3B show the surface of the electrostatic chuck.

FIG. 3A is an SEM image of the surface of the electrode layer 12, and FIG. 3B is an SEM image of the surface (first major surface 11a) of the ceramic dielectric substrate 11.

Here, the mean grain size is calculated by the following method, for example. Namely, the ceramic dielectric substrate 11 is prepared by carrying out processes such as sectioning, thermal etching, and the like, and carrying out measurements at a plurality of locations on SEM photographs with a 5000 magnification in order to determine the grain boundary. At a single measurement location, the major axis when ellipse approximation is performed to the grain boundary is taken to be the grain size. Then, the mean value of 100 measurements of grain size is taken to be the mean grain size.

Based on the SEM image shown in FIG. 3A, it is found by measuring 100 crystal grains included in the second portion 122 of the electrode layer 12 that the mean grain size is approximately 1.0 μm. On the other hand, based on the SEM image shown in FIG. 3B, it is found by measuring 100 crystal grains included in the ceramic dielectric substrate 11 that the mean grain size is approximately 1.7 μm.

Within the electrode layer 12, the first portion 121 and the second portion 122 form a three-dimensional network. The network formed by the first portion 121 is a conductive network.

When the mean grain size of the crystals included in the second portion 122 is not less than the mean grain size of the crystals included in the ceramic dielectric substrate 11, the conductive network of the first portion 121 can be easily disrupted. On the other hand, when the mean grain size of the crystals included in the second portion 122 is smaller than the mean grain size of the crystals included in the ceramic dielectric substrate 11, the conductive network of the first portion 121 is difficult to disrupt.

In addition, when the second portion 122 enters the gaps of the first portion 121, the first dielectric layer 111 and the second dielectric layer 112 can be easily connected by the second portion 122. Therefore, it is possible to both ensure the conductivity of the electrode layer 12, and to improve the bond between the electrode layer 12 and the ceramic dielectric substrate 11.

The second portion 122 is provided so as to link the first dielectric layer 111 and the second dielectric layer 112. The second portion 122 includes a portion 122a that extends in a direction not parallel to the direction along the first major surface 11a (the direction along the X-Y plane). The portion 122a connects the first dielectric layer 111 and the second dielectric layer 112.

The second portion 122 is provided so as to be embedded between the particles of metal material in the first portion 121. In other words, the first portion 121 is in the form of, for example, an ant's nest. The second portion 122 is provided so that it can enter the gaps of the first portion 121. The second portion 122 includes a portion 122b enclosed by the metal particles of the first portion 121, and the portion 122a that extends so as to penetrate the first portion 121 in the Z direction.

The second portion 122 mechanically joins the first dielectric layer 111 and the second dielectric layer 112. In other words, the portion 122a of the second portion 122 is integrally sintered with the first dielectric layer 111 and the second dielectric layer 112. The portion 122a has the function of joining the first dielectric layer 111 and the second dielectric layer 112. In this way, it is possible to increase the mechanical bonding between the electrode layer 12 and the ceramic dielectric substrate 11.

The material of the second portion 122 is the same as the material of the ceramic dielectric substrate 11. The material of the second portion 122 is, for example, a polycrystalline ceramic sintered body, the same as for the ceramic dielectric substrate 11. When the material of the second portion 122 is the same as the material of the ceramic dielectric substrate 11, the adhesive sinterability between the first dielectric layer 111 and the second dielectric layer 112 is increased by the second portion 122. In this way, it is possible to effectively prevent peeling of the electrode layer 12.

The electrode layer 12 is a composite mixture of the first portion 121 and the second portion 122, so it has a configuration that enables it to be strongly bonded to the ceramic dielectric substrate 11, while providing conductivity. By incorporating this electrode layer 12 in the ceramic dielectric substrate 11, it is possible to satisfy both the conductivity of the electrode layer 12, which is an internal electrode layer, and the bond with the ceramic dielectric substrate 11.

Preferably, the first portion 121 and the second portion 122 are directly joined in the electrode layer 12. In other words, the first portion 121 and the second portion 122 are in mutual contact. There is no sintering agent between the first portion 121 and the second portion 122. In this way, impurities such as glass or the like do not diffuse within the ceramic dielectric substrate 11, and sufficient plasma durability of the ceramic dielectric substrate 11 is ensured.

The thickness of the electrode layer 12 is not more than approximately 15 μm. By making the thickness off the electrode layer 12 not more than approximately 15 μm, concentration of stress in the electrode layer 12 is relieved. Also, it is possible to effectively prevent peeling of the electrode layer 12 from the ceramic dielectric substrate 11.

Table 1 shows the results of an investigation into the relationship between the thickness of the electrode layer 12 and peeling.

TABLE 1

| | Thickness of electrode layer (μm) | | | | |
|---|---|---|---|---|---|
| | 1 | 2 | 4 | 15 | 30 |
| Result | No peeling | No peeling | No peeling | No peeling | Peeling |
| Judgment | ○ | ○ | ○ | ○ | x |

Here, electrode layers 12 were fabricated with thicknesses of 1 μm, 2 μm, 4 μm, 15 μm, and 30 μm, and the bond with the ceramic dielectric substrate 11 was investigated. The state of peeling was observed by SEM. In Table 1, cases in which no cracking was seen by external observation and no peeling was seen by SEM are indicated by the ○ symbol, and cases where there was cracking or peeling are indicated by the × symbol. As shown in Table 1, when the thickness of the electrode layer 12 exceeded 30 μm, peeling occurred. When the thickness of the electrode layer 12 exceeded 30 μm, it is considered that differences in shrinkage increase, and peeling and cracking can occur.

FIGS. 4A to 4C are explanatory views of the action of the second portion.

FIG. 4A schematically illustrates a case where the mean grain size of crystals CR included in the second portion 122 is large, and FIG. 4B schematically illustrates a case where the mean grain size of the crystals included in the second portion 122 is small. FIG. 4C shows the ratio of the mean grain size d of the crystals CR to the thickness t of the electrode layer 12 (d/t), and the state of conductivity and peeling during sintering.

As illustrated in FIGS. 4A and 4B, contact points occur at the portions where adjacent crystals CR contact. It can be seen that there are more contact points CP when the mean grain size of the crystals CR is small (see FIG. 4B) than when it is large (see FIG. 4A).

Also, as shown in FIG. 4C, preferably, the mean grain size d of the crystals CR included in the second portion 122 is not more than ½ the thickness t of the electrode layer 12. When the mean grain size d of the crystals CR included in the second portion 122 is not less than half the thickness t of the electrode layer 12, the effects such as reduction in the number of contact points with the base material which can cause peeling, and reduction in the number of conducting paths which can cause conduction defects, and the like increase. In order to ensure that the crystals CR included in the second portion 122 enter the electrode layer 12 and to ensure the conductivity and bonding by the first portion 121, it is necessary that the mean grain size d of the crystals CR included in the second portion 122 is not more than ½ the thickness t of the electrode layer 12.

Therefore, if the thickness of the electrode layer 12 is, for example, 15 μm, preferably, the mean grain size of the crystals included in the second portion 122 is not more than 7.5 μm.

Next, an example of a manufacturing method of the electrostatic chuck 110 according to this embodiment is described. In this embodiment, an example of sheet forming is provided, but the manufacturing method is not limited to this, and hot pressing or extrusion forming or the like can be used.

(Fabrication of Alumina Green Sheet)

A binder, a solvent, and the like are added to alumina powder, and after mixing and pulverizing the mixture in a ball mill, defoaming is performed, and a green sheet is formed. Preferably, the aluminum powder to be used has few impurities, and the purity is not less than 99.9% by weight, and more preferably is not less than 99.99% by weight. At least one type of resin can be selected as the binder, selected from the group consisting of vinyl resin such as polyvinyl alcohol, polyvinyl butyral, polyvinyl chloride, and the like; a cellulose resin such as methyl cellulose, ethyl cellulose, hydroxyethyl cellulose, and the like; and an acrylic resin such as polyacrylic ester, polymethyl methacrylate, and the like. Alternatively, a water-soluble binder resin, or another commonly used binder that can be used for processing ceramic sheet products may be used. Next, a single solvent or a mixture of two or more solvents selected from methyl ethyl ketone, ethyl alcohol, isopropyl alcohol, toluene, diethyl ether, ethylene trichloride, methanol, and the like, can be used as the solvent. However, provided the solvent is capable of dissolving the binder, there is no limitation on the solvent.

(Production and Formation of Metallized Paste)

The metallized paste for forming the electrode layer 12 is produced as follows. Binder and the like is added to the mixture of alumina powder and Pd powder, and mixed in a three-roll mill to form metallized paste.

Next, using the metallized paste, an internal electrode pattern to form the electrode layer 12 is printed on the alumina green sheet by the screen printing method. Also, metallized paste may be printed on another alumina green sheet with through holes and via holes provided for connecting to external terminals to be formed later. Also, formation of the electrode is not limited to the screen printing method, but deposition methods such as physical vapor deposition (PVD), CVD and the like may be used.

(Lamination of the Alumina Green Sheets)

Next, the alumina green sheets are mutually positioned, laminated, and thermocompression bonded, to fabricate a stacked body with the overall required thickness.

(Sintering, and HIP Processing of Laminated Alumina Green Sheets)

Next, the stacked body is sintered at not less than 1250° C. and not more than 1700° C., and more preferably at not less than 1300° C. and not more than 1450° C., sintering the internal electrode pattern at the same time. The sintering is not limited to a sintering atmosphere such as an air atmosphere, a reducing atmosphere, or the like. After sintering, the temperature and pressure are set again and the hot isostatic pressing (HIP) process is carried out. The HIP process conditions are preferably a pressurizing gas (for example, Ar) pressure of not less than approximately 1000 atmospheres, and the temperature of not less than 1200° C. and not more than 1600° C., depending on the sintering temperature.

(Formation of External Terminals)

Next, an external electrode is formed. A counterboring process using a drill or the like is carried out on one side of the dielectric body (alumina sintered body), to expose the internal through hole or via hole. An electrode terminal is connected to this counterbored portion by brazing, soldering, using conductive adhesive, or the like.

(Processing the Alumina Sintered Body)

The front and rear surfaces of the alumina sintered body (ceramic dielectric substrate 11) are ground, so that the thickness of the first dielectric layer 111 of the alumina sintered body substrate (the distance from the adhering surface to the electrode layer 12) is the desired thickness.

(Joining)

The ceramic dielectric substrate 11 in which the electrode layer 12 is formed and the baseplate 50 are joined.

(Producing a Surface Pattern)

After grinding the ceramic dielectric substrate 11 that has been joined to the baseplate 50 to obtain the required thickness, the protrusions 13 are formed to the required size and height on the surface by the sandblasting method.

The electrostatic chuck 110 with the protrusions 13 formed on the surface can be obtained as described above.

(Working Examples)

The following is a further description of the electrode layer 12 based on working examples.

Pd powder and alumina powder (purity 99.99%) were prepared, a metallized paste in which the content of alumina was not less than 0 vol % and not more than 70 vol % was produced, and the results of fabricating electrostatic chucks are shown in Table 2.

TABLE 2

| | Electrode layer (vol %) | | After sintering | | After HIP | |
|---|---|---|---|---|---|---|
| | Pd | Alumina | Adhesion | Conduction resistance (Ω) | Adhesion | Conduction resistance (Ω) |
| Comparative Example 1 | 100 | 0 | X (Occurrence of peeling and cracking in all cases) | — | — | — |
| Comparative Example 2 | 70 | 30 | Δ (Occurrence of cracking in some cases) | 0.41 | ○ | 0.39 |
| Working Example 1 | 50 | 50 | ○ | 0.85 | ○ | 0.67 |
| Working Example 2 | 30 | 70 | ○ | No conductivity | ○ | 1.25 |

Working Example 1 included Pd 50 vol % and alumina 50 vol %. The sintering and grinding were carried out without a problem, and the adhesion force to the internal electrode layer was sufficient. Also, the internal electrode layer used in the electrostatic chuck had sufficient conductivity.

Figure 5:
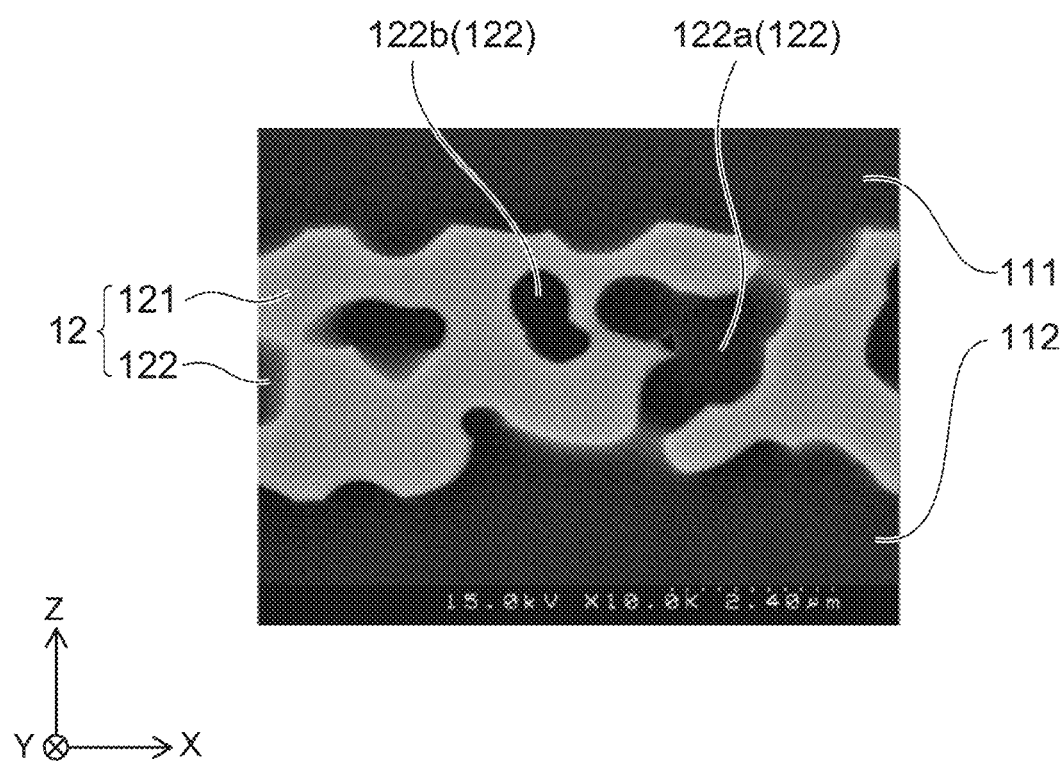
FIG. 5 shows the electrode layer.

FIG. 5 shows the electrode layer.

FIG. 5 shows an SEM image of a cross-section of the electrode layer 12 after sintering. In FIG. 5, the white portions are Pd.

As shown in FIG. 5, the electrode layer 12 is precise with no gaps, and the Pd particles are in close contact and continuous. Therefore, the conductivity is good, and in addition, there is good contact between the electrode layer 12 and the high purity alumina layers (the first dielectric layer 111 and the second dielectric layer 112) above and below the electrode layer 12.

Also, mixed sintering was carried out with the high purity alumina and electrode raw materials without the use of sintering agent or the like, so the contact surface area between the alumina is reduced, and the alumina particles added to the electrode layer 12 remain as very fine particles without growing larger. In this way, it is possible to fabricate the electrode layer 12 satisfying both close contact and conductivity.

Working Example 2 included Pd 30 vol % and alumina 70 vol %. After sintering, the electrode layer 12 had no conductivity, but by HIP processing, sufficient conductivity was provided for use in the electrostatic chuck. Also, sintering and grinding were carried out without a problem, and sufficient adhesion force to the electrode layer 12 was exhibited.

(Evaluation of Plasma Resistance)

Plasma irradiation tests were carried out and evaluated on samples as described below, for the reduction (durability) in surface roughness of the alumina sintered body due to plasma irradiation. The test samples were obtained by cutting a portion of the electrostatic chucks fabricated in Working Examples 1 and 2, and grinding their surfaces to a surface roughness Ra of not more than 0.03 μm. These test samples were subject to plasma irradiation, and the change in surface roughness Ra was measured. The plasma irradiation was carried out using a reactive ion etching device (Anelva Corporation, DEA-506), and etching gas of $CF_4:O_2=4:1$ at 1000 W for 30 hours.

As a result, the surface roughness Ra after 10 hours of plasma irradiation was 0.12 μm, and after 30 hours of the irradiation, the surface roughness Ra was 0.13 μm. There was almost no change in the surface roughness Ra for not less than 10 hours of plasma irradiation, so it was confirmed that an alumina sintered body with good plasma resistance had been fabricated.

In Comparative Example 1, alumina was not added and the content of Pd was 100 vol %. In this case, the adhesion between the alumina layer and the internal electrode layer was insufficient, so the thermal stresses during sintering could not be withstood, so in all cases, peeling or cracking occurred at the boundary between the internal electrode layer and the alumina layer.

Comparative Example 2 included Pd 70 vol % and alumina 30 vol %. In this case also, the adhesion between the alumina layer and the internal electrode layer was insufficient, so during sintering, peeling or cracking occurred at the boundary between the internal electrode layer and the alumina layer.

Next, warping of the sintered body is described.

A sintered body was disposed with any face (for example, the first major surface 11a or the second major surface 11b) as the top face (measurement face) with the sintered body supported at three points. Arbitrary three positions on the measurement face were measured with an electrical micrometer, and the flatness of the flat face formed by these three positions was set to zero. Next, the maximum measurement value of the electrical micrometer and the minimum measurement value of the electrical micrometer on the measurement face were measured, and their difference was calculated as the flatness. Warping of the sintered body was evaluated based on this flatness.

An example of the results is as follows. Namely, when the thickness of the sintered body was 1 mm, the flatness was approximately 2000 μm. When the thickness of the sintered body was 3.5 mm, the flatness was approximately 700 μm. When the thickness of the sintered body was 5 mm, the flatness was approximately 300 μm. From this, it can be seen that when the thickness of the sintered body is relatively thick, the warping of the sintered body is relatively small.

The thickness of the electrostatic chuck substrate 100 is, for example, from approximately 0.5 mm to 10 mm. Preferably, the thickness of the electrostatic chuck substrate 100 is from approximately 0.5 mm to 7 mm. More preferably, the thickness of the electrostatic chuck substrate 100 is from approximately 0.5 mm to 5 mm.

According to this embodiment, it is possible to provide an electrostatic chuck capable of improving the adhesion between the internal electrode layer and the ceramic dielectric substrate, and improving the conductivity of the internal electrode layer.

The embodiment of the invention has been described above. However, the invention is not limited to the above description. Those skilled in the art can suitably modify the above embodiment, and such modifications are also encompassed within the scope of the invention as long as they include the features of the invention.

Furthermore, various components in the above embodiment can be combined with each other as long as technically feasible. Such combinations are also encompassed within the scope of the invention as long as they include the features of the invention.

What is claimed is:

1. An electrostatic chuck, comprising: a ceramic dielectric substrate having a first major surface on which an object to be processed is mounted, and a second major surface on a side opposite the first major surface, the ceramic dielectric substrate being a polycrystalline ceramic sintered body; and
   an electrode layer interposed between the first major surface and the second major surface of the ceramic dielectric substrate, the electrode layer being integrally sintered with the ceramic dielectric substrate,
   the ceramic dielectric substrate including a first dielectric layer between the electrode layer and the first major surface, and a second dielectric layer between the electrode layer and the second major surface, and
   the electrode layer includes a first portion having conductivity, and a second portion that bonds the first dielectric layer and the second dielectric layer, and
   the mean grain size of crystals included in the second portion is smaller than the mean grain size of crystals included in the ceramic dielectric substrate.

2. The electrostatic chuck according to claim 1, wherein the second portion includes a portion that extends in a direction not parallel to the first major surface.

3. The electrostatic chuck according to claim 2, wherein the crystal grains included in the ceramic dielectric substrate are bonded to the crystal grains included in the second portion by a solid phase sintering or a liquid phase sintering without use of a sintering agent.

4. The electrostatic chuck according to claim 1, wherein the crystal grains included in the ceramic dielectric substrate are bonded together by the solid phase sintering or the liquid phase sintering without use of a sintering agent.

5. The electrostatic chuck according to claim 1, wherein the first portion is directly bonded to the second portion.

6. The electrostatic chuck according to claim 1, wherein the purity of the ceramic dielectric substrate is not less than 99.9% by weight.

7. The electrostatic chuck according to claim 3, wherein the material of the second portion is the same as the material of the ceramic dielectric substrate.

8. The electrostatic chuck according to claim 1, wherein the thickness of the first dielectric layer is not less than 100 micrometers.

9. The electrostatic chuck according to claim 1, wherein the thickness of the electrode layer is not more than 15 micrometers.

10. The electrostatic chuck according to claim 1, wherein the mean grain size of the crystals included in the second portion is not more than ½ the thickness of the electrode layer.

11. The electrostatic chuck according to claim 1, wherein the material of the crystals included in the ceramic dielectric substrate is $Al_2O_3$.

12. The electrostatic chuck according to claim 1, wherein the first portion includes a continuous region wherein conductive particles are bonded together.

13. The electrostatic chuck according to claim 1, wherein in a cross-section along an X-Y plane of the electrode layer an occupancy ratio of the second portion is in a range of 12 area % to 65 area %.

14. The electrostatic chuck according to claim 1, wherein within the electrode layer the first and second portions form a three-dimensional network, including a conductive network formed by the first portion.

* * * * *